United States Patent [19]

Wyatt

[11] Patent Number: 4,912,434

[45] Date of Patent: Mar. 27, 1990

[54] DIGITAL CONTROL FOR ANALOG PHASE LOCKED LOOP

[75] Inventor: Michael A. Wyatt, Clearwater, Fla.

[73] Assignee: Honeywell Inc., Minneapolis, Minn.

[21] Appl. No.: 316,335

[22] Filed: Feb. 27, 1989

[51] Int. Cl.⁴ ............................................... H03L 7/10
[52] U.S. Cl. ......................................... 331/17; 331/25
[58] Field of Search ...................... 331/1 A, 17, 23, 25; 329/325

[56] References Cited

U.S. PATENT DOCUMENTS

| | | | |
|---|---|---|---|
| 4,243,941 | 1/1981 | Zdunek | 331/17 X |
| 4,495,475 | 1/1985 | Mark et al. | 331/17 X |
| 4,506,232 | 3/1985 | Thompson | 331/17 X |
| 4,546,329 | 10/1985 | Unger | 331/17 X |

*Primary Examiner*—David Mis
*Attorney, Agent, or Firm*—Haugen and Nikolai

[57] ABSTRACT

A phase locked loop including a digital control is provided. A phase detector having first and second inputs and an output connected to a loop filter which responds to the digital control so as to modify the output. The loop filter further comprises apparatus for integrating and a first apparatus for amplifying the modified phase detector output, each of which provides an output signal. An apparatus for digitally controlling the loop filter parameters responds to externally generated digital commands so as to vary loop parameters. A first apparatus for generating a voltage controlled oscillation signal is connected to the first input, where the voltage controlled oscillation apparatus includes a voltage control signal input. Further included is a second apparatus for generating a voltage control signal responsive to the sum of the output signals of the integrating apparatus and first amplifying apparatus, where the second generating apparatus transmits the voltage control signal to the voltage control signal input of the first generating apparatus so as to control the oscillation frequency. In one embodiment of the invention, the digital control apparatus comprises a digital-to-analog converter which responds to externally generated digital signals to provide a variable resistance so as to correspondingly change the natural frequency and damping of the phase locked loop in response to the external digital signals.

14 Claims, 2 Drawing Sheets

DIGITAL CONTROL FOR ANALOG PHASE LOCKED LOOP

UNITED STATES GOVERNMENT RIGHTS

The U.S. Government has contributed to the design and development of the invention and, therefore, has obtained certain rights in the invention.

BACKGROUND OF THE INVENTION

The invention is directed generally to control electronics and, more particularly, to an analog phase locked loop wherein the natural frequency and damping factors are digitally controlled.

Phase locked loops are well known in the art as analog systems that automatically track a frequency fluctuating input signal. Referring to FIG. 1, a general description of an embodiment of the invention is shown. The phase locked loop includes a voltage controlled oscillator (VCO) 12 whose frequency is controlled by the voltage $V_c$ which is the filtered voltage from a phase detector 10. This causes a VCO frequency to move toward the input signal $V_i$. The voltage output $V_c$ is available for communications applications, such as receivers, tone detectors and other well-known applications for phase locked loops.

A phase locked loop is characterized by two factors, the natural frequency ($\omega_n$) and damping (Zeta). In any application, it is desirable to adapt the performance of the phase locked loop to changing conditions. This could be done by controlling $\omega_n$ and Zeta. This is particularly advantageous when trying to recover a signal which may be buried in noise. The invention provides such control of $\omega_n$ and Zeta. In one example of an embodiment of the invention, an 8-bit digital-to-analog converter is used yielding a control range of 256 to 1 for each factor.

SUMMARY OF THE INVENTION

A phase locked loop including a digital control is provided. A phase detector having first and second inputs and an output is connected to a loop filter which responds to digital control by changing the natural frequency and damping characteristics of the loop so as to modify the output of the phase detector. The loop filter further comprises a means for integrating and a first means for amplifying the modified phase detector output, each of which provides an output signal. A means for digitally controlling the loop filter parameters responds to externally generated digital commands so as to vary loop parameters. A first means for generating a voltage controlled oscillation signal is connected to the first input. The voltage controlled oscillation means also includes a voltage control signal input. Further included is a second means for generating a voltage control signal responsive to the sum of the output signals of the integrating means and the first amplifying means, where the second generating means transmits the voltage control signal to the voltage control signal input of the first generating means so as to control the frequency of the oscillation signal.

In one embodiment of the invention, the digital control means comprises a digital-to-analog converter which responds to externally generated digital signals to provide variable resistances so as to correspondingly change the natural frequency and damping characteristics of the phase locked loop in response to the external digital signals.

It is one object of the invention to provide a digital control of an analog phase locked loop so as to allow variance of $\omega_n$ and Zeta over a wide range.

It is yet another object of the invention to provide an improved phase locked loop which allows faster recovery of a signal out of a background of noise.

It is yet another object of the invention to provide digitally variable resistors which control loop parameters $\omega_n$ and Zeta.

It is yet another object of the invention to provide an improved phase locked loop having a digitally controlled loop filter.

It is another object of the invention to provide a system whereby loop dynamics and acquisition characteristics can be adjusted, via computer, in real-time to optimize loop performance.

Other features, objects and advantages of the invention will become apparent to those skilled in the art through the description of the preferred embodiment, claims and drawings herein wherein like numerals refer to like elements.

DETAILED DESCRIPTION OF THE PREFERRED EMBODIMENT

Figure 1:
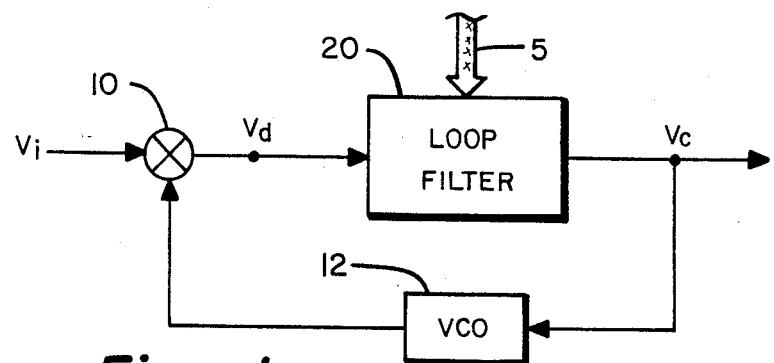
FIG. 1 is a block diagram which schematically shows one embodiment of the digitally controlled phase locked loop of the invention.

FIG. 1 shows one embodiment of a digitally controlled phase locked loop employing the digitally controlled loop filter of the invention. The phase locked loop shown in FIG. 1 comprises a phase detector 10 having first and second inputs, an output, a loop filter 20, and a voltage controlled oscillator (VCO) 12. Loop filter 20 further includes a digital control input bus 5. The phase detector 10 and VCO 12 may advantageously be any commercially available device, the uses and deployment of which are well known in the art.

Figure 2:
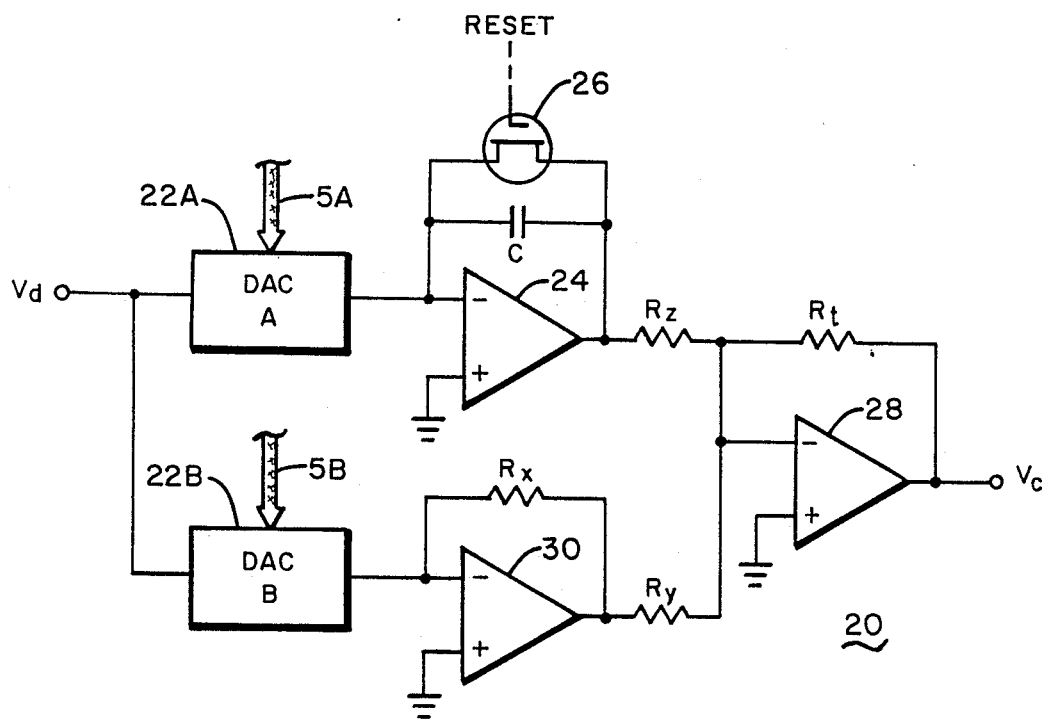
FIG. 2 is a schematic illustration of one embodiment of the digitally controlled loop filter circuit of the invention.

Referring now to FIG. 2, loop filter 20 is shown in more detail. The loop filter comprises digital-to-analog converters 22A and 22B, which are also referenced as DAC A and DAC B. The loop further comprises amplifiers 24, 28 and 30 with associated resistors $R_x$, $R_y$, $R_z$ and $R_t$. Further included are capacitor C and FET 26. The circuit shown in FIG. 2 allows digital control of the natural frequency ($\omega_n$) and damping (Zeta) of an analog phase locked loop such as is shown in FIG. 1, for example. With the system shown in FIG. 2, the loop dynamics and acquisition characteristics can be adjusted, via computer, in real time to optimized loop performance. The phase locked loop can be characterized, by the following equations:

$$\omega_n = \left(\frac{K_o K_d}{\tau_1}\right)^{\frac{1}{2}}$$

Figure 3:
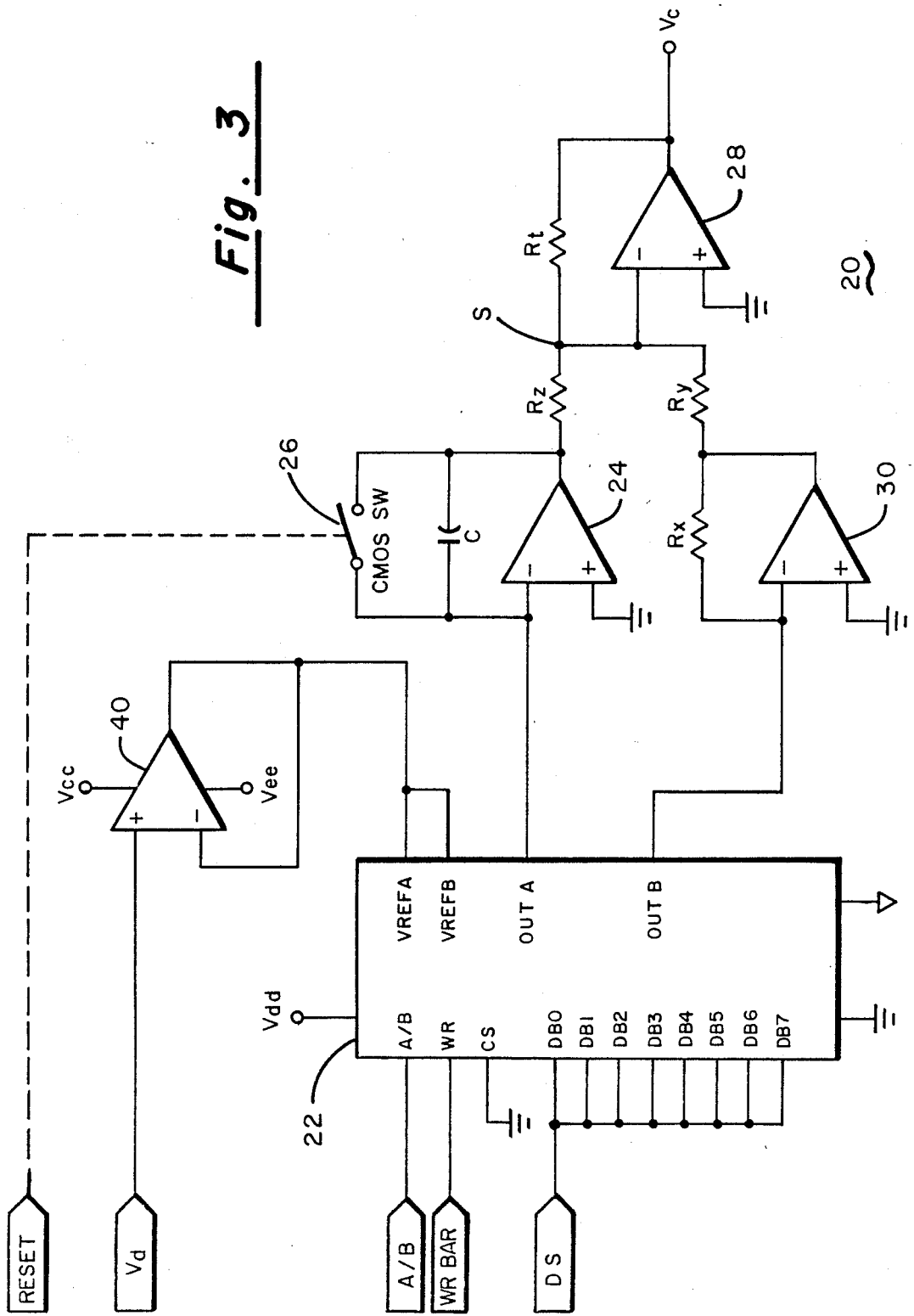
FIG. 3 is a more detailed schematic diagram of an alternative embodiment of a digitally controlled phase locked loop filter of the invention.

-continued where $\tau_1 = \frac{R_a R_z C}{K R_t}$, and $R_A$ is the effective resistance provided by DAC A; $K_o$ is the effective gain constant for the VCO in radians per second per volt; $K_d$ is the phase detector gain constant in volts per radian; and K is a gain constant associated with the loop to represent any other extraneous gains, such as the gain associated with amplifier 40 as shown in FIG. 3.

$$Zeta = \frac{\tau_2 \omega_n}{2},$$

where $\tau_2 = \frac{R_A R_x R_z C}{R_B R_y}$, and $R_B$ is the effective resistance provided by DAC B.

As can be seen by the above relationships, DACs A and B provide digital variable resistors $R_A$ and $R_B$ which control loop parameters $\omega_n$ and Zeta. A separate reset 26 is provided for integrator capacitor C to reset to zero initial condition. The reset may preferably be a CMOS, FET or other equivalent types of solid state switching devices. As will be appreciated by those skilled in the art, therefore, a phase locked loop filter comprises an integrator function and a lead function where the lead function determines the amount of the signal to be diverted around the integrator. In the system shown in FIG. 2, the integrator function is performed substantially by amplifier 24 in combination with capacitor C. The lead function is performed substantially by amplifier 30 in combination with feedback resistor $R_x$ and output resistor $R_y$. This combination produces a loop filter which can be controlled digitally, as by computer, and thus loop parameters can also be controlled digitally because the loop filter controls most of the phase locked loop parameters.

Referring now to FIG. 3, an alternative embodiment of one example of the invention is shown schematically. The digital control phase locked loop filter shown in FIG. 3 comprises a DAC having dual channel capabilities 22, buffer amplifier 40, first, second and third amplifiers 24, 28 and 30 and associated resistors $R_z$, $R_t$, $R_y$ and $R_x$. For most operations, CMOS switch 26 may also be incorporated into the design. However, those skilled in the art will recognize that there are some applications which would not require the use of CMOS switch 26. In one embodiment of the invention, the DAC comprised Analog Devices model no. AD7528 digital-to-analog converter. The amplifiers 26, 28, 24 and 40 may be contained in a model no. LF347N which is a quad amplifier manufactured by National Semiconductor. Other models, such as Burr Brown OPA2111 dual op amps, may advantageously be employed as well as similar devices known to those skilled in the art.

Having described generally the elements of the invention, the operation of the invention will now be described in order to provide a better understanding of the principals of the invention. As best shown in FIG. 3, buffer amplifier 40 receives an input $V_d$ at its non-inverting input. The input is then fed into DAC 22 reference channels for A and B, VREFA and VREFB, respectively. The control line designated A/B directs the digital word DS to either DACA or DACB. WR bar latches DS into DACA or DACB. DAC 22 then presents a variable resistance $R_A$ or $R_B$ as determined by the channel selected to the output of the buffer amplifier 40. $\omega_n$ and Zeta are controlled by, in this example, an 8-bit digital control signal DS. This gives a range of control of $\omega_n$ and Zeta over a range of about 1 to 256. The data DS may be input by an external computer, microprocessor, or simply by external manual switches in a less sophisticated implementation of the invention. Other implementations will be readily apparent to those skilled in the art.

Both A and B channels may supply output signals simultaneously through outputs OUTA and OUTB. Output OUTA is transmitted to the integrator circuit comprised of capacitor C, amplifier 24 and CMOS switch 26. Prior to receiving the input signal, the integrator may be reset to an initial condition, preferably 0, through the use of reset switch 26. The output signal from output OUTB is simultaneously fed into amplifier 30 which provides a gain to the B signal according to the values of $R_x$ and $R_y$. The outputs of the integrator and the leading function amplifier 30 are then summed at summing point S and fed into amplifier 28 which supplies the output $V_c$ to the VCO and also to any application circuitry.

Those skilled in the art will recognize that there are various alternative digital and analog implementations which would embody the principals of the invention. The examples given herein are meant to serve as illustrations for the purpose of describing the invention and are not by way of limitation on the invention.

The invention has been described herein in considerable detail in order to comply with the Pat. Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A phase locked loop comprising:
    a phase detector having first and second inputs and an output;
    a means for digitally controlling the natural frequency and damping characteristics as applied to the phase detector output to modify the phase detector output;
    a loop filter having a natural frequency and damping characteristic further comprising a means for integrating and a first means for amplifying the modified phase detector output;
    a first means for generating a voltage controlled oscillation signal to the first input, where the voltage controlled oscillation means includes means for inputting a voltage control signal; and
    a second means for generating the voltage control signal responsive to the sum of the output signals of the integrating means and first amplifying means so as to control the frequency of the voltage controlled oscillation signal.

2. The apparatus of claim 1 wherein the digital control means comprises a digital-to-analog converter which responds to externally generated signals to provide a variable resistance so as to correspondingly change the natural frequency and damping of the phase locked loop in response to the external signals.

3. The apparatus of claim 2 wherein the integration means further comprises a second means for amplifying having capacitive feedback.

4. The apparatus of claim 3 wherein the integration means further comprises a means for resetting the feedback capacitance.

5. The apparatus of claim 4 wherein the first amplifier means comprises an operational amplifier having feedback gain resistors.

6. The apparatus of claim 5 wherein the second generating means comprises an operational amplifier.

7. The apparatus of claim 4 wherein the reset means comprises an FET connected in parallel with the capacitive feedback.

8. A control for a phase locked loop including a phase detector having an output and first and second inputs and further including a voltage controlled oscillator having a control signal input and a signal output connected to a second input of the phase detector where the control comprises:

means for providing first and second variable resistances so as to control the natural frequency and damping of the loop in response to external control signals;

means for integrating the detector output connected through the first variable resistance means;

first means for amplifying the detector output connected through the second variable resistance means; and means for generating a voltage control signal responsive to the phase detector output by responding the sum of the output signals of the integrating means and first amplifying means.

9. The apparatus of claim 8 wherein the variable resistance means comprises a digital-to-analog converter which responds to externally generated signals to provide a variable resistance so as to correspondingly change the natural frequency and damping of the phase locked loop in response to the external signals.

10. The apparatus of claim 9 wherein the integration means further comprises a second means for amplifying having capacitive feedback.

11. The apparatus of claim 10 wherein the integration means further comprises a means for resetting the feedback capacitance.

12. The apparatus of claim 11 wherein the first amplifier means comprises an operational amplifier having feedback and gain resistors.

13. The apparatus of claim 12 wherein the generating means comprises an operational amplifier.

14. The apparatus of claim 13 wherein the reset means comprises an FET connected in parallel with the capacitive feedback.

* * * * *